US010655218B2

(12) United States Patent
Kamakura

(10) Patent No.: US 10,655,218 B2
(45) Date of Patent: May 19, 2020

(54) SUBSTRATE PROCESSING APPARATUS, METHOD OF MANUFACTURING SEMICONDUCTOR DEVICE, AND RECORDING MEDIUM

(71) Applicant: HITACHI KOKUSAI ELECTRIC INC., Tokyo (JP)

(72) Inventor: Tsukasa Kamakura, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/220,979

(22) Filed: Jul. 27, 2016

(65) Prior Publication Data

US 2017/0029945 A1  Feb. 2, 2017

(30) Foreign Application Priority Data

Jul. 29, 2015 (JP) .................. 2015-149214

(51) Int. Cl.
*C23C 16/44* (2006.01)
*H01L 21/02* (2006.01)
(Continued)

(52) U.S. Cl.
CPC ........ *C23C 16/4412* (2013.01); *C23C 16/402* (2013.01); *C23C 16/4405* (2013.01);
(Continued)

(58) Field of Classification Search
CPC ............ C23C 16/4412; C23C 16/4584; C23C 16/402; C23C 16/45578; C23C 16/4405;
(Continued)

(56) References Cited

U.S. PATENT DOCUMENTS 4,699,805 A * 10/1987 Seelbach ............... C23C 16/455
118/715
5,427,625 A * 6/1995 Okase ................. C23C 16/4401
134/18
(Continued)

FOREIGN PATENT DOCUMENTS

JP       10-149988       6/1998
JP     2008-041915 A    2/2008
(Continued)

OTHER PUBLICATIONS

Office Action dated Jul. 29, 2017 in KR counterpart application KR2016-0096030).

(Continued)

*Primary Examiner* — Jeffrie R Lund
(74) *Attorney, Agent, or Firm* — Volpe and Koenig, P.C.

(57) ABSTRACT

A substrate processing apparatus is disclosed. The substrate processing apparatus includes a gas supply system which supplies a gas into a process chamber, an exhaust system which discharges the gas existing within the process chamber; and a gas supply pipe which supplies the gas into the process chamber via holes, and disposed inside the process chamber, where one end of the gas supply pipe is connected to the gas supply system, the other end of the gas supply pipe is connected to the exhaust system via a pipeline outside the process chamber.

13 Claims, 16 Drawing Sheets

(51) Int. Cl.
*C23C 16/46* (2006.01)
*C23C 16/455* (2006.01)
*C23C 16/458* (2006.01)
*C23C 16/40* (2006.01)

(52) U.S. Cl.
CPC .... *C23C 16/4584* (2013.01); *C23C 16/45561* (2013.01); *C23C 16/45578* (2013.01); *C23C 16/46* (2013.01); *H01L 21/0228* (2013.01); *H01L 21/02164* (2013.01); *H01L 21/02211* (2013.01); *H01L 21/02271* (2013.01)

(58) Field of Classification Search
CPC .............. C23C 16/45561; C23C 16/46; H01L 21/02271
USPC ......................................... 118/715, 724, 725
See application file for complete search history.

(56) References Cited

U.S. PATENT DOCUMENTS

| | | | | |
|---|---|---|---|---|
| 5,902,102 | A * | 5/1999 | Nam | H01L 21/67017 118/715 |
| 7,037,376 | B2 * | 5/2006 | Harvey | B08B 7/0035 118/715 |
| 7,383,841 | B2 * | 6/2008 | Shinriki | C23C 16/4405 134/10 |
| 8,808,455 | B2 * | 8/2014 | Saito | H01L 21/02186 118/696 |
| 9,869,022 | B2 * | 1/2018 | Sawada | C23C 16/45565 |
| 10,081,868 | B2 * | 9/2018 | Takagi | C23C 16/45531 |
| 2002/0124800 | A1 * | 9/2002 | Moriyama | C30B 31/16 118/715 |
| 2003/0077920 | A1 * | 4/2003 | Noda | C23C 16/24 438/788 |
| 2004/0081607 | A1 * | 4/2004 | Hasegawa | B01D 53/68 423/240 R |
| 2005/0115501 | A1 * | 6/2005 | Toriya | C23C 16/4402 118/715 |
| 2005/0208217 | A1 * | 9/2005 | Shinriki | C23C 16/34 427/248.1 |
| 2006/0062913 | A1 * | 3/2006 | Wang | C23C 16/4412 427/248.1 |
| 2006/0110943 | A1 | 5/2006 | Swerts et al. | |
| 2006/0266288 | A1 * | 11/2006 | Choi | C23C 16/4405 118/715 |
| 2008/0075838 | A1 * | 3/2008 | Inoue | C23C 8/10 427/58 |
| 2008/0083372 | A1 | 4/2008 | Inoue et al. | |
| 2010/0058984 | A1 * | 3/2010 | Marubayashi | C23C 16/24 118/715 |
| 2011/0039420 | A1 * | 2/2011 | Nakao | B05D 1/60 438/781 |
| 2012/0160172 | A1 * | 6/2012 | Wamura | C23C 16/4402 118/726 |
| 2013/0143348 | A1 * | 6/2013 | Ota | H01L 31/1876 438/57 |
| 2013/0164943 | A1 * | 6/2013 | Koshi | H01L 21/02057 438/758 |
| 2013/0260566 | A1 | 10/2013 | Yamasaki | |
| 2015/0096494 | A1 * | 4/2015 | Nishiura | C23C 16/52 118/697 |
| 2017/0029945 | A1 * | 2/2017 | Kamakura | C23C 16/4412 |
| 2019/0244790 | A1 * | 8/2019 | Kamakura | H01L 21/0228 |

FOREIGN PATENT DOCUMENTS

| | | |
|---|---|---|
| JP | 2009-295729 | 12/2009 |
| JP | 2011-054590 A | 3/2011 |
| JP | 2011-146458 | 7/2011 |
| JP | 2013-157491 A | 8/2013 |
| KR | 2007-0051279 | 5/2007 |
| KR | 20130075677 A | 7/2013 |
| KR | 2013-0111356 | 10/2013 |

OTHER PUBLICATIONS

Korean Office Action dated Mar. 29, 2018 for the Korean Patent Application No. 10-2016-0096030.

Japanese Office Action dated Sep. 20, 2018 for the Japanese Patent Application No. 2015-149214.

* cited by examiner

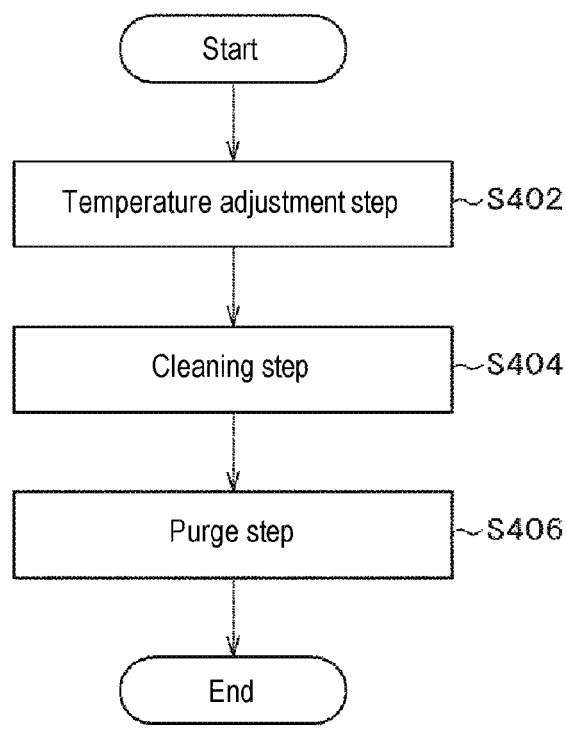

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is based upon and claims the benefit of priority from Japanese Patent Application No. 2015-149214, filed on Jul. 29, 2015, the entire contents of which are incorporated herein by reference.

TECHNICAL FIELD

The present disclosure relates to a substrate processing apparatus, a method of manufacturing a semiconductor device, and a recording medium.

BACKGROUND

A semiconductor manufacturing apparatus is available as one example of a substrate processing apparatus. Furthermore, a vertical apparatus is known as one example of the semiconductor manufacturing apparatus. The semiconductor manufacturing apparatus of this kind includes a substrate holder (boat) configured to hold substrates (wafers) in multiple stages. A plurality of substrates is transferred from a transfer chamber to the substrate holder. While holding the substrates in place, a process gas is supplied from a nozzle installed in a process chamber of a processing furnace, thereby processing the substrates.

SUMMARY

The present disclosure provides embodiments of a configuration capable of improving the film thickness uniformity of substrates mounted in multiple stages.

According to one embodiment of the present disclosure, there is provided a configuration, including: a gas supply system configured to supply a gas to a process chamber; an exhaust system configured to discharge the gas existing in the process chamber; a gas supply pipe having holes, configured to supply the gas to the process chamber via the holes, and disposed inside the process chamber, wherein one end of the gas supply pipe connected to a pipeline which is connected to the gas supply system, the other end of the gas supply pipe connected to the exhaust system outside the process chamber; and a controller configured to control: the exhaust system to purge the gas from the gas supply system via the pipeline bypassing the process chamber, and the supply system to supply the gas to the process chamber via the holes.

BRIEF DESCRIPTION OF THE DRAWINGS

FIG. 14 is a flowchart for explaining a cleaning process of the process chamber and the nozzle suitably used in the embodiment of the present disclosure.

DETAILED DESCRIPTION

Figure 1:
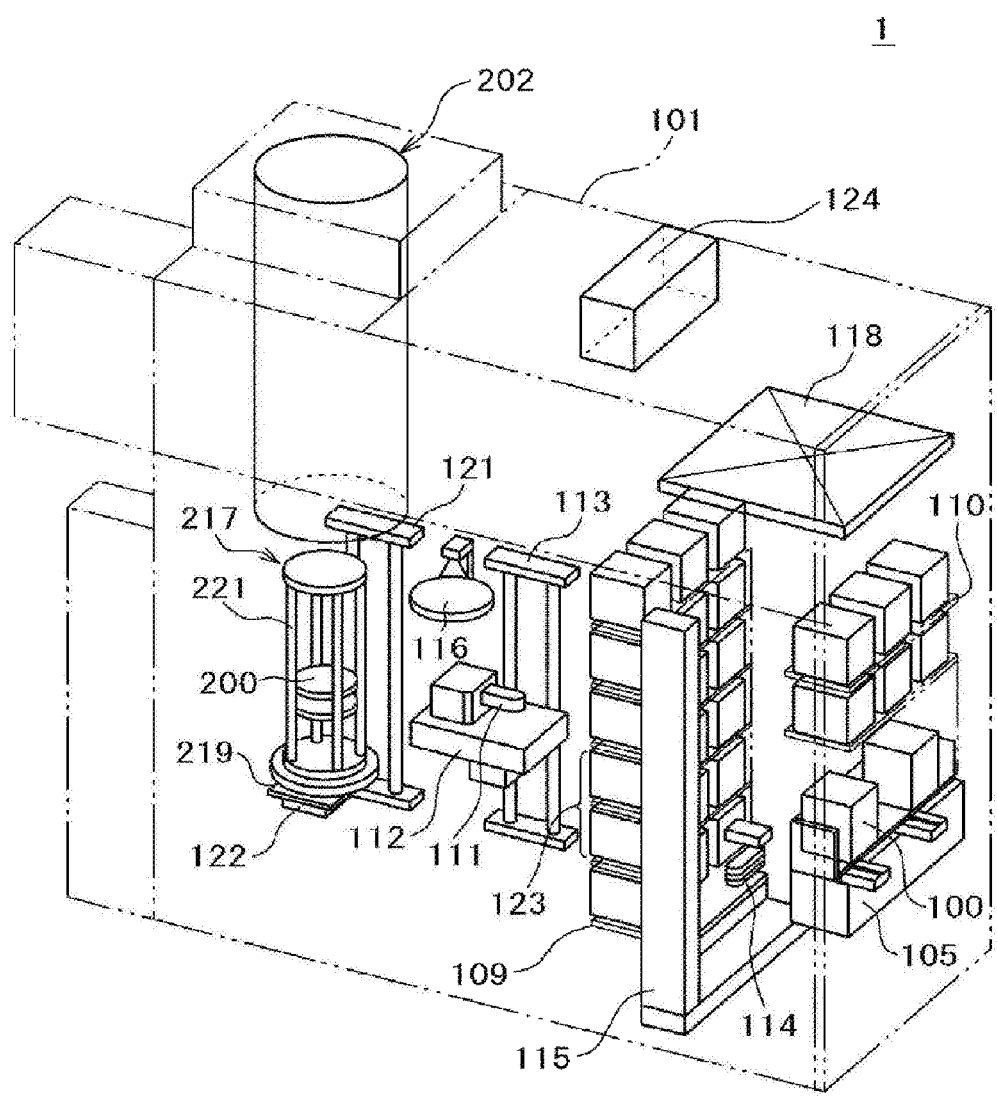
FIG. 1 is a perspective view illustrating a substrate processing apparatus suitably used in an embodiment of the present disclosure.

One embodiment of the present disclosure will now be described in detail with reference to the drawings. In the following descriptions, there may be a case where the same components are designated by like reference numerals with the repeated descriptions thereof omitted. In the drawings, for the sake of clear description, there may be a case where the width, thickness and shape of individual parts are expressed more schematically than actual ones. However, this is nothing more than one example and is not intended to limit the construction of the present disclosure.

Figure 11:
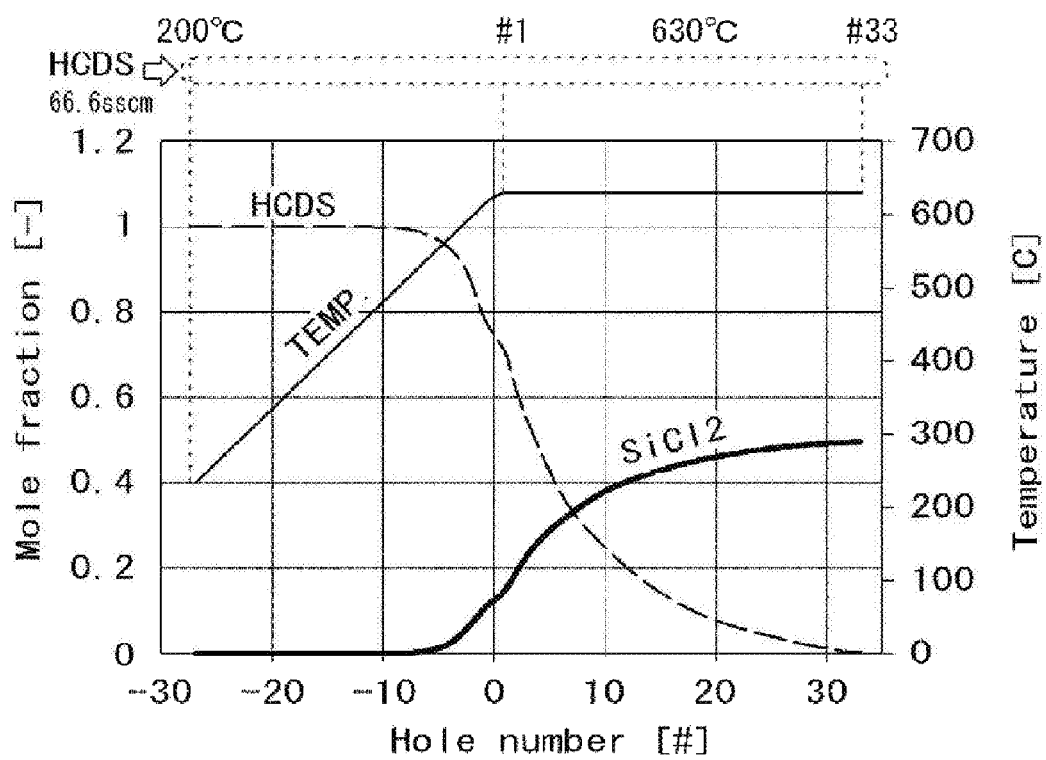
FIG. 11 is a view for explaining a $Si_2Cl_6$ gas phase reaction within a nozzle of a substrate processing apparatus according to a comparative example.

First of all, the present inventors have studied a vertical processing furnace having a porous nozzle. In the vertical processing furnace having a porous nozzle, one of the factors that makes it difficult to control the inter-plane (top and bottom regions) film thickness uniformity and the distribution shape is precursor decomposition. Hereinafter, descriptions will be made thereon with reference to FIG. 11. FIG. 11 is a view illustrating a simulation result of precursor gas decomposition within nozzles. In FIG. 11, the simulation is performed by supplying hexachlorodisilane ($Si_2Cl_6$, abbreviation: HCDS) as a precursor gas at a flow rate of 66.6 sccm. At this time, the internal pressure of a process chamber is 20 Pa.

In a semiconductor device manufacturing apparatus which supplies a precursor gas using a nozzle-type supply pipe installed within a substrate processing chamber, the supply pipe (hereinafter referred to as a nozzle) includes its one end connected to a precursor supply device and the other end closed within the substrate processing chamber. The precursor gas is introduced from a precursor supply system into the nozzle. The precursor gas introduced into the nozzle is heated by a heat source, for example, a resistance heater, which is installed outside the substrate processing chamber. In the aforementioned structure having the nozzle closed at one end, the precursor gas is introduced into the nozzle at a temperature (200 degrees C.° in FIG. 11) controlled by the precursor supply system and is then heated to a pre-set temperature (a nozzle wall temperature of 630 degrees C.° in FIG. 11) by a resistance heater. The flow velocity of the precursor gas within the nozzle is high in the vicinity of an inlet and is gradually reduced toward a terminal end. The temperature gradient of the precursor gas within the nozzle is largely governed by the flow velocity of the precursor gas. In other words, the precursor gas receives a larger amount of heat from the heat source as the flow velocity thereof becomes lower. Thus, the precursor gas is rapidly heated within the nozzle and the temperature gradient grows steep. Decomposition of the precursor gas is accelerated in keeping with the increase of the temperature. Thus, the precursor gas existing within the nozzle is decomposed in accordance with the temperature gradient. When viewed from the side of the precursor supply system, the temperature gradient is generated between the first hole (#1 in FIG. 11) and the last hole (#33 in FIG. 11), namely the hole nearest to the closed end of the nozzle, among a plurality of holes which is installed in the nozzle to supply the precursor gas into the substrate processing chamber. For that reason, in the first hole where the precursor gas temperature is low, the decomposition of the precursor gas, for example, the decomposition represented by the following formula (1) in the case of $Si_2Cl_6$, is the main decomposition process. Thus, the percentage of $SiCl_2$ (or $SiCl_4$) in the precursor gas is small (In FIG. 11, the mole fraction of $SiCl_2$ is about 0.1).

$$Si_2Cl_6 \rightarrow SiCl_2 + SiCl_4 \quad (1)$$

On the other hand, the precursor gas is sufficiently heated in the vicinity of the last hole. Thus, most of the precursor is decomposed into $SiCl_2$ and $SiCl_4$ (In FIG. 11, the mole fraction of $SiCl_2$ is about 0.5). The percentage of decomposition is determined by the temperature of the resistance heater, the decomposition temperature of the gas and so forth. In the case of $Si_2Cl_6$, $SiCl_2$ contributes to the film formation after decomposition. In the processed substrate existing in the vicinity of the first hole, the film thickness becomes small in the region near the nozzle hole and the in-plane thickness variation grows larger. On the other hand, $SiCl_2$ is abundant in the vicinity of the last hole. Thus, the decline of the film thickness is not observed in the vicinity of the nozzle hole.

Highly-integrated recent devices have a complex structure. Thus, the surface area thereof usually becomes larger. For that reason, a method of alternately supplying a precursor gas having good coverage and a reaction gas is often used. However, if active gas species such as $SiCl_2$ and the like exist, a CVD reaction is partially generated. Therefore, a decrease in coverage may occur.

<Embodiment of the Present Disclosure>

Figure 4:
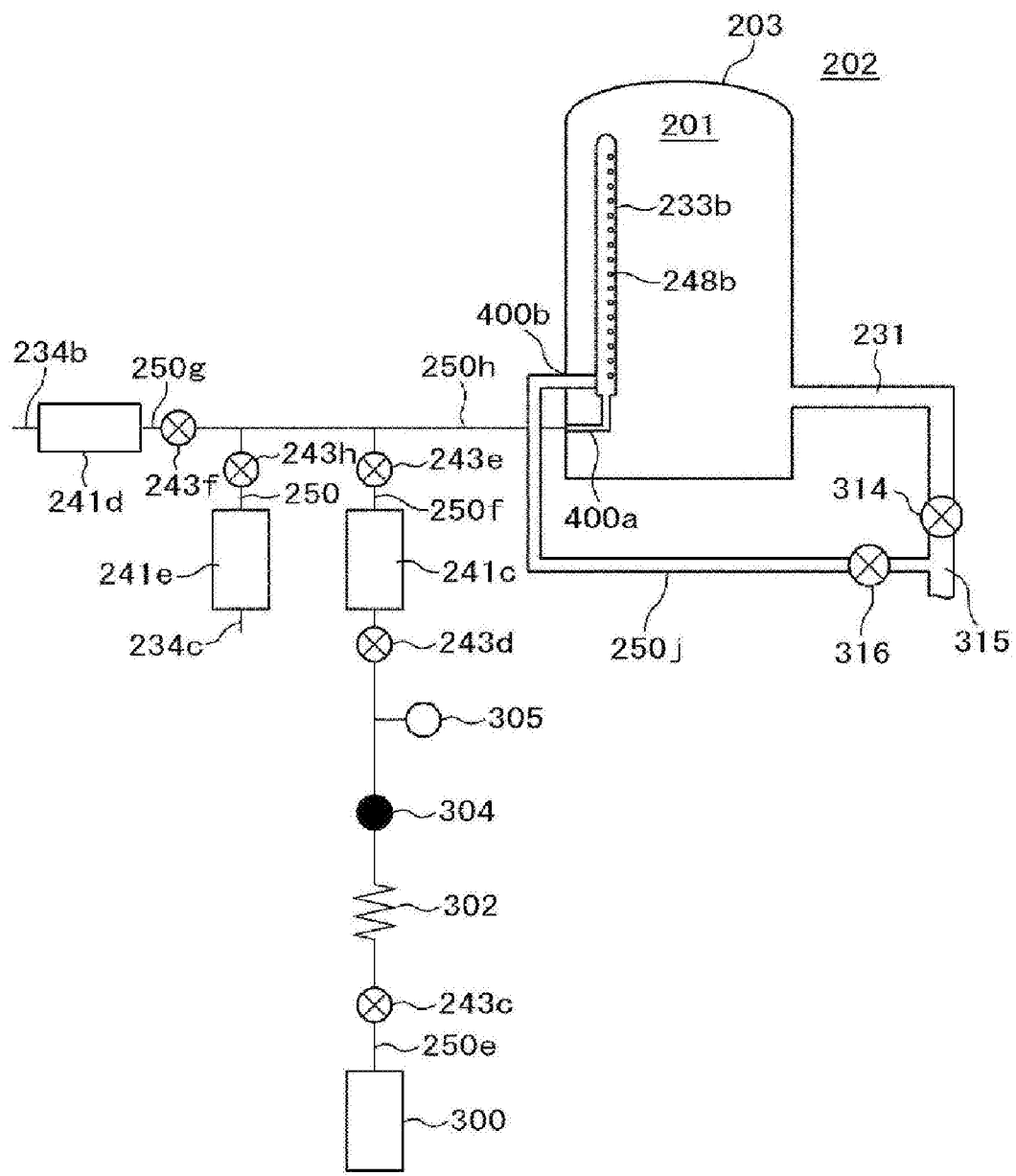
FIG. 4 is a view for explaining a gas supply system in the processing furnace suitably used in the embodiment of the present disclosure.

Accordingly, in a substrate processing apparatus according to an embodiment of the present disclosure, as illustrated in FIG. 4 or 5, for the purpose of reducing a temperature gradient of a precursor gas within a nozzle, the nozzle end is opened and is connected to, for example, an exhaust pipeline, in order to keep high a flow velocity within the nozzle so that the temperature of the precursor gas does not increase at the downstream side of the nozzle. Thus, according to the present embodiment, it is possible to control the decomposition of a precursor within a nozzle and to improve the uniformity of films deposited on a plurality of processed substrates installed within a substrate processing chamber.

In the following descriptions, a vertical apparatus for performing an oxidation process, a diffusion process, a CVD process or the like with respect to substrates (hereinafter simply referred to as a processing apparatus) will be described as the substrate processing apparatus.

(1) Processing Apparatus

As illustrated in FIG. 1, a processing apparatus 1 which uses a cassette 100 as a wafer carrier for storing wafers (substrates) 200 made of silicon or the like includes a housing 101. A cassette stage (substrate container delivery table) 105 is installed inside a cassette loading/unloading gate (not shown) of the housing 101. The cassette 100 is loaded onto the cassette stage 105 by an in-process transfer device (not shown) and is unloaded from above the cassette stage 105. The cassette 100 is mounted on the cassette stage 105 by the in-process transfer device so that the wafers 200 existing within the cassette 100 have a vertical posture and the wafer port of the cassette 100 is oriented upward. The cassette stage 105 is configured to rotate the cassette 100 rightward by 90 degrees C.° in a vertical direction so that the wafers 200 existing within the cassette 100 have a horizontal posture and the wafer port of the cassette 100 is oriented toward the rear side of the housing 101.

A cassette rack (substrate container mounting rack) 109 is installed in a substantially central region in a front-rear direction within the housing 101. The cassette rack 109 is configured to store a plurality of cassettes 100 in multiple stages and in multiple rows. Transfer racks 123 which receive the cassettes 100 are installed in the cassette rack 109. A preliminary cassette rack 110 is installed above the cassette stage 105 and is configured to preliminarily store the cassettes 100. A cassette elevator (substrate container elevating mechanism) 115 capable of moving up and down while holding the cassette 100 and a cassette loader 114 are disposed between the cassette stage 105 and the cassette rack 109. The cassette elevator 115 and the cassette loader 114 are configured to transfer the cassette 100 between the cassette stage 105, the cassette rack 109 and the preliminary cassette rack 110 through the successive operations thereof.

A wafer loader 112 capable of horizontally rotating or linearly moving the wafers 200 and a loading elevator 113 for moving the wafer loader 112 up and down are disposed at the rear side of the cassette rack 109. The loading elevator 113 is installed in the right end portion of the pressure-resistant housing 101. The loading elevator 113 and the wafer loader 112 are configured to charge and discharge the wafers 200 with respect to a boat (substrate holding means) 217 through the successive operations thereof using tweezers (substrate holding member) 111 of the wafer loader 112 as a wafer mounting part.

A processing furnace 202 is installed at the rear upper side of the housing 101. A lower end portion of the processing furnace 202 is opened and closed by a furnace opening shutter (furnace opening opening/closing mechanism) 116. A boat elevator (substrate holder elevating mechanism) 121 as an elevator mechanism for moving a boat 217 up and down with respect to the processing furnace 202 is installed under the processing furnace 202. A seal cap 219 as a lid is horizontally installed in an elevator member 122 as a connection member connected to an elevator stand of the boat elevator 121. The seal cap 219 is configured to vertically support the boat 217 and to hermetically seal the lower end portion of the processing furnace 202. The boat 217 as a substrate holding means includes a plurality of boat posts 221. The boat 217 is configured to horizontally hold a plurality of (e.g., 50 to 150) wafers 200 in a state in which the wafers 200 are arranged in a vertical direction with the centers thereof aligned with one another.

As illustrated in FIG. 1, a clean unit 118 formed of a supply fan and a dust-proof filter is installed above the cassette rack 109 so as to supply a clean air as a purified atmospheric gas. The clean unit 118 is configured to circulate the clean air within the housing 101.

Next, the operation of the processing apparatus 1 will be described. As illustrated in FIG. 1, the cassette 100 is loaded from the cassette loading/unloading gate and is mounted on the cassette stage 105 so that the wafers 200 have a vertical posture and the wafer gate of the cassette 100 is oriented upward. Thereafter, the cassette 100 is rotated rightward by 90 degrees C.° in a vertical direction toward the rear side of the housing 101 by the cassette stage 105 so that the wafers 200 existing within the cassette 100 have a horizontal posture and the wafer port of the cassette 100 faces the rear side of the housing 101. Then, the cassette 100 is automatically transferred and delivered to a designated rack position of the cassette rack 109 or the preliminary cassette rack 110 and is temporarily stored therein. Thereafter, the cassette 100 is transferred from the cassette rack 109 or the preliminary cassette rack 110 to the transfer rack 123 or is directly transferred to the transfer rack 123.

When the cassette 100 is transferred to the transfer rack 123, the wafer 200 is picked up from the cassette 100 through the wafer port by the tweezers 111 of the wafer loader 112 and is charged to the boat 217. The wafer loader 112 which has delivered the wafer 200 to the boat 217 comes back to the cassette 100 and charges the next wafer 200 to the boat 217.

When a predetermined number of wafers 200 are charged to the boat 217, the lower end portion of the processing furnace 202 closed by the furnace opening shutter 116 is opened by the furnace opening shutter 116. Subsequently, the boat 217 holding the group of wafers 200 is loaded into the processing furnace 202 as the seal cap 219 is moved upward by the boat elevator 121.

After the boat 217 is loaded, the wafers 200 are subjected to an arbitrary process within the processing furnace 202. After the wafers 200 are processed, the wafers 200 and the cassette 100 are discharged to the outside of the housing 101 in an order opposite to the aforementioned order.

(1-1) Processing Furnace

Figure 2:
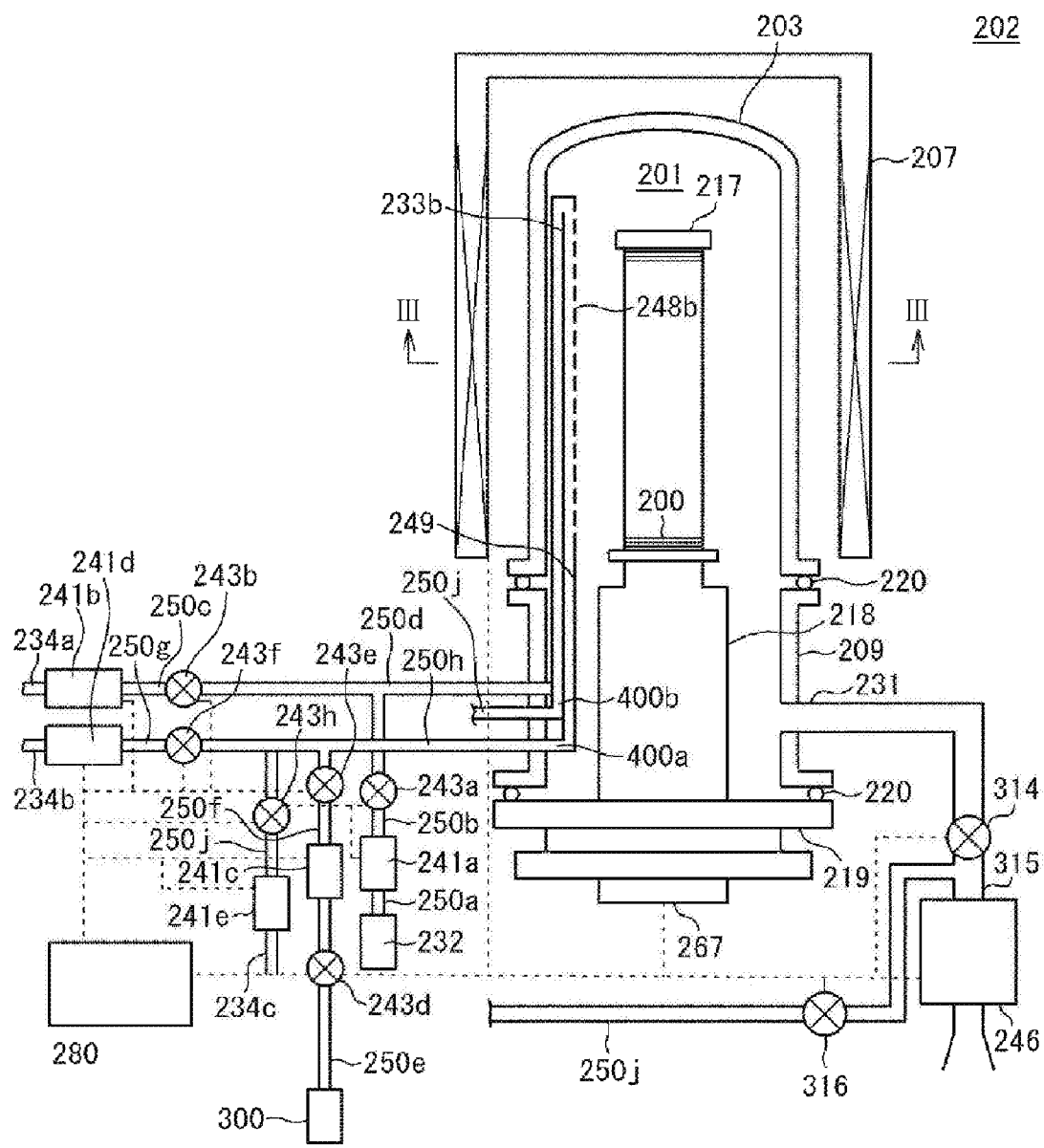
FIG. 2 is a schematic configuration view of a processing furnace suitably used in the embodiment of the present disclosure, in which a portion of the processing furnace is shown in a vertical cross section.

Next, the aforementioned processing furnace 202 will be described in detail with reference to FIGS. 2 and 3. As illustrated in FIG. 2, a reaction tube 203 as a reaction vessel for processing the wafers 200 as substrates is installed inside the heater 207 which is a heating device (heating means). A manifold 209 made of, for example, stainless steel, is installed in the lower end portion of the reaction tube 203 through an O-ring 220 which is a sealing member. The lower end opening of the manifold 209 is hermetically sealed through an O-ring 220 by the seal cap 219 which is a lid. A process chamber (reaction chamber) 201 is formed by at least the reaction tube 203, the manifold 209 and the seal cap 219. The boat 217, which is a substrate holding member (substrate holding means), is erected on the seal cap 219 through a boat support table 218. The boat support table 218 serves as a holding body that holds the boat 217. The boat 217 is inserted into the process chamber 201. A plurality of wafers 200 to be processed batch-wise is mounted on the boat 217 in a horizontal posture and in a multiple stages along a tube axis direction. The heater 207 heats the wafers 200 inserted into the process chamber 201 to a predetermined temperature.

(1-2) Gas Supply System

Two gas supply systems as supply routes for supply plural kinds (two kinds, in the present embodiment) of process gases are installed in the process chamber 201.

(First Gas Supply System)

Figure 3:
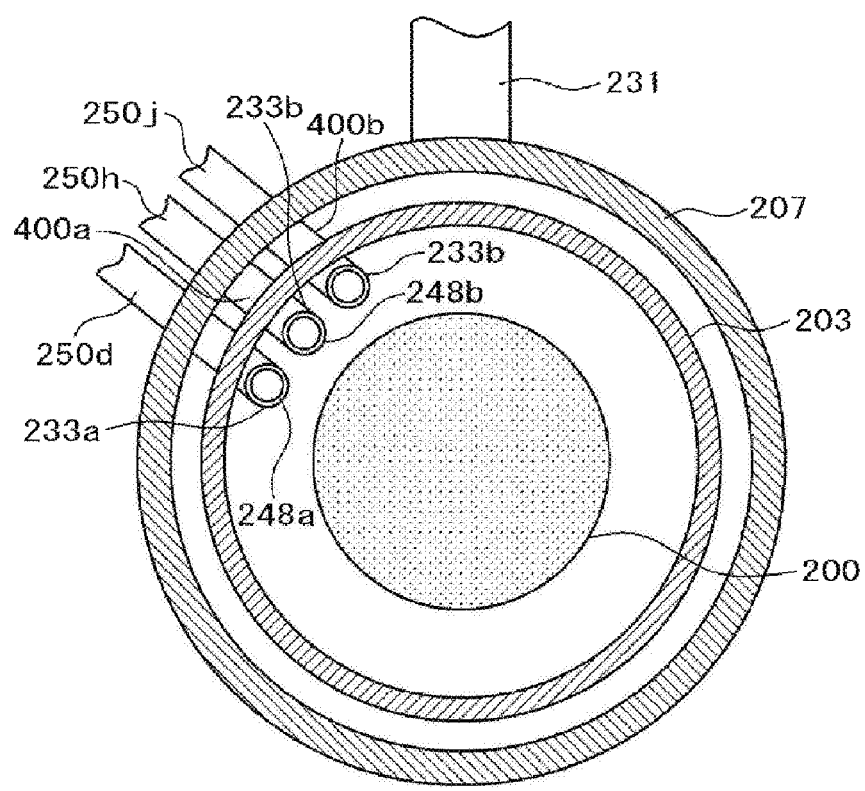
FIG. 3 is a cross-sectional view of the processing furnace taken along line in FIG. 2.

As illustrated in FIGS. 2 and 3, a first gas supply system is formed of a first gas supply line and a first carrier gas supply line. The first gas supply line is formed of a first gas supply part 232, a first pipeline 250a, a first mass flow controller 241a as a flow rate control device (flow rate control means), a second pipeline 250b and a first valve 243a as an opening/closing valve, which are sequentially disposed from the upstream side. The first carrier gas supply line is formed of a first carrier gas supply pipe 234a for supplying a carrier gas, a second mass flow controller 241b as a flow rate control device (flow rate control means), a third pipeline 250c and a second valve 243b as an opening/closing valve, which are sequentially disposed from the upstream side. The output of the first valve 243a of the first gas supply line and the output of the second valve 243b of the first carrier gas supply line are merged and connected to a fourth pipeline 250d. A first nozzle 233a is installed in the front end portion of the fourth pipeline 250d so as to extend from the lower side of the reaction tube 203 toward the upper inner wall of the reaction tube 203 along the stacking direction of the wafers 200 within an arc-shape space between the inner wall of the reaction tube 203 defining the process chamber 201 and the wafers 200. First gas supply holes 248a, which are supply holes for supplying gas, are formed on the side surface of the first nozzle 233a. The first gas supply holes 248a have the same opening area over a region spanning from the lower portion to the upper portion thereof. Furthermore, the first gas supply holes 248a are formed at the same opening pitch. The first gas supply holes 248a may have a hole diameter of 0.1 to 5 mm and the number of the first gas supply holes 248a may be three times or less of the number of the wafers to be processed.

Accordingly, a first gas is supplied from the first gas supply part 232 through the first pipeline 250a, the first mass flow controller 241a, the second pipeline 250b and the first valve 243a and is merged with a carrier gas supplied from the first carrier gas supply pipe 234a through the second mass flow controller 241b, the third pipeline 250c and the second valve 243b. The first gas and the carrier gas thus merged are supplied into the process chamber 201 through the fourth pipeline 250d and the first gas supply holes 248a formed in the first nozzle 233a.

(Second Gas Supply System)

Figure 5A:
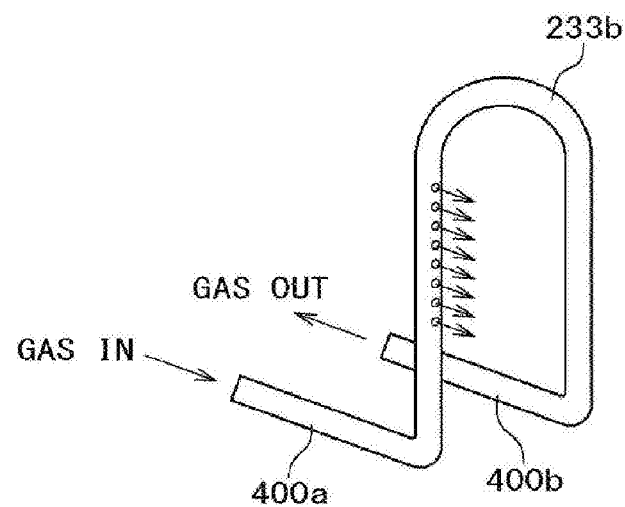
FIG. 5A is a view for explaining a shape of a nozzle according to an exemplary embodiment.

Next, a second gas supply system for supplying a precursor gas to the process chamber 201 will be described in detail with reference to FIGS. 4 and 5. The second gas supply system is formed of a second gas supply line, a second carrier gas supply line and a cleaning gas supply line. The second gas supply line is formed of a precursor supply part 300 for accommodating a precursor, a fifth pipeline 250e, a third valve 243c as an opening/closing valve, a filter 302, a regulator 304, a manometer 305, a fourth valve 243d as an opening/closing valve, a third mass flow controller 241c as a flow rate control device (flow rate control means), a sixth pipeline 250f and a fifth valve 243e as an opening/closing valve, which are sequentially disposed from the upstream side. The second carrier gas supply line is formed of a second carrier gas supply pipe 234b for supplying a carrier gas, a fourth mass flow controller 241d as a flow rate control device (flow rate control means), a seventh pipeline 250g and a sixth valve 243f as an opening/closing valve, which are sequentially disposed from the upstream side. Furthermore, the cleaning gas supply line is formed of a cleaning gas supply pipe 234c for supplying a cleaning gas, a fifth mass flow controller 241e as a flow rate control device (flow rate control means), a ninth pipeline 250i and a seventh valve 243h as an opening/closing valve, which are sequentially disposed from the upstream side. The output of the fifth valve 243e of the second gas supply line, the output of the sixth valve 243f of the second carrier gas supply line and the output of the seventh valve 243h of the cleaning gas supply line are merged and connected to an eighth pipeline 250h. Furthermore, the eighth pipeline 250h is connected to a pipeline 400a disposed within the process chamber 201. According to the embodiment of the present disclosure, an each of end of U-shaped nozzle 233b as a second nozzle 233b is opened. As illustrated in FIG. 5A, the pipeline 400a is connected to one lower end of the U-shaped nozzle 233b. The other lower end of the U-shaped nozzle 233b is connected to a pipeline 400b disposed within the process chamber 201. The pipeline 400b is connected to an exhaust pipeline 315 through a tenth pipeline 250j. The second nozzle 233b is installed within an arc-shape space between the inner wall of the reaction tube 203 defining the process chamber 201 and the wafers 200 so as to extend from the lower side of the reaction tube 203 toward the upper inner wall of the reaction tube 203 along the stacking direction of the wafers 200. Second gas supply holes 248b, which are supply holes for supplying gas, are formed on the side surface of the second nozzle 233b. As illustrated in FIG. 5A, the second gas supply holes 248b have the same opening area over a region spanning from the lower portion of the side of the gas supply system (the side of the pipeline 400a) to the upper portion thereof. Furthermore, the second gas supply holes 248b are formed at the same opening pitch. The second gas supply holes 248b may have a hole diameter of 0.1 to 5 mm and the number of the second gas supply holes 248b may be three times or less of the number of the wafers to be processed. By adjusting the hole diameter and/or the hole number in this way, it is possible to make uniform the flow rate of the gas supplied from the nozzle.

Accordingly, a second gas as a precursor gas is supplied from the precursor supply part 300 through the fifth pipeline 250e, the third valve 243c, the filter 302, the regulator 304, the manometer 305, the fourth valve 243d, the third mass flow controller 241c, the sixth pipeline 250f and the fifth valve 243e and is merged with a carrier gas supplied from the second carrier gas supply pipe 234b through the fourth mass flow controller 241d, the seventh pipeline 250g and the sixth valve 243f. The second gas and the carrier gas thus merged are passing through the eighth pipeline 250h and the pipeline 400a and are supplied from the lower end side of the second nozzle 233b into the process chamber 201 through the second gas supply holes 248b.

Figure 5B:
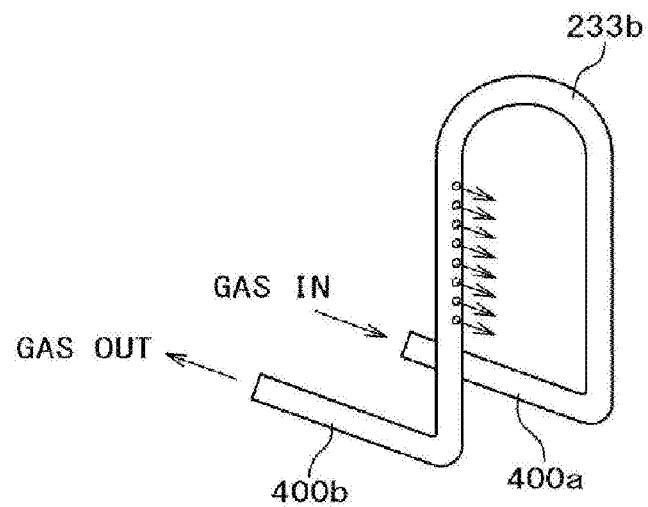
FIG. 5B is a view for explaining the shape of the nozzle according to the exemplary embodiment.

According to the embodiment of the present disclosure, as illustrated in FIG. 5A, the second gas supply holes 248b are arranged from the lower portion to the upper portion of the second nozzle 233b at the gas supply system side. However, as illustrated in FIG. 5B, the second gas supply holes 248b may be arranged from the upper portion to the lower portion of the second nozzle 233b at the gas exhaust system side. In addition, the first nozzle 233a and the second nozzle 233b may be included in the first gas supply system and the second gas supply system, respectively.

(1-3) Exhaust System

Furthermore, the process chamber 201 is connected to a vacuum pump 246 as an exhaust device (exhaust means) via a valve 314 by a gas exhaust pipe 231 which is an exhaust pipe for exhausting gas, so that the process chamber 201 is vacuum-exhausted. The valve 314 is an opening/closing valve which can perform vacuum exhaust and vacuum exhaust stop of the process chamber 201 by opening and closing the valve and which can regulate the internal pressure of the process chamber 201 by adjusting the valve opening degree.

Furthermore, a valve 316, for example, a needle valve, which adjusts conductance, is installed in a line extending from the process chamber 201 to the exhaust pipeline 315 (between the tenth pipeline 250j and the exhaust pipeline 315) so as to control the flow velocity within the second nozzle 233b.

Figure 6:
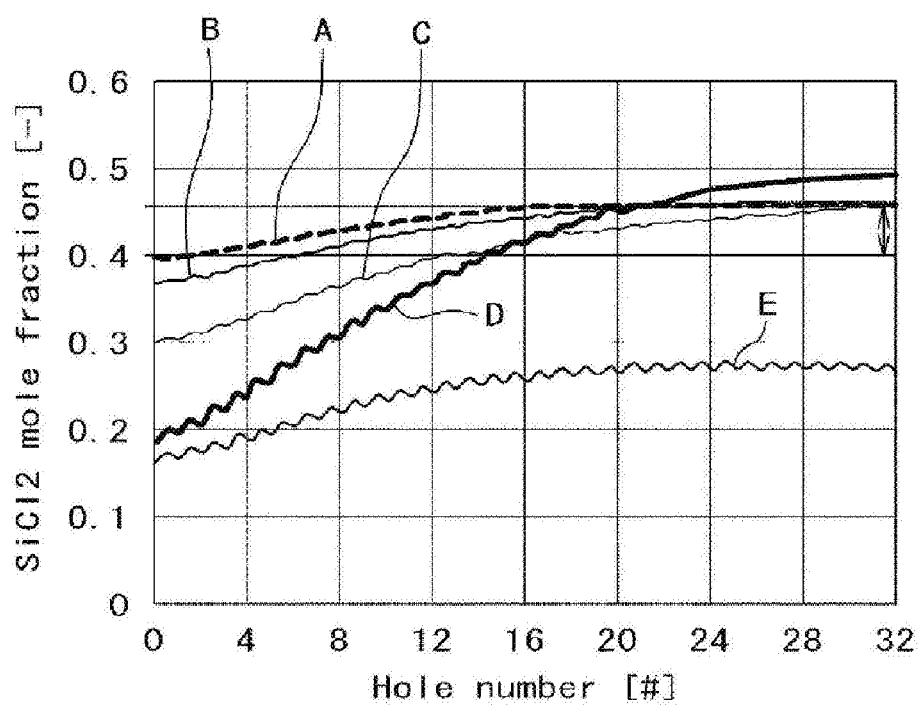
FIG. 6 is a view for explaining an effect of the nozzle according to the exemplary embodiment.

The relationship between the exhaust pressure of the nozzle and the decomposition of the gas (e.g., $SiCl_2$) will be described with reference to FIG. 6. FIG. 6 is a view illustrating a simulation result of a mole fraction of $SiCl_2$ in a nozzle according to an exemplary embodiment. In FIG. 6, there are illustrated variations of a mole fraction of $SiCl_2$ between gas supply holes in the case where the nozzle exhaust pressure is set at 10 Pa, 25 Pa, 50 Pa and 400 Pa. At this time, the internal temperature of the process chamber is 630 degrees C.° and the internal pressure of the process chamber is 20 Pa. When the nozzle exhaust pressure is 25 Pa (indicated by a broken line A) and 50 Pa (indicated by a solid line B), the variations of the mole fraction are small. However, when the nozzle exhaust pressure is between 10 Pa (indicated by a solid line C) and 400 Pa (indicated by a solid line D), the variations of the mole fraction are large. Accordingly, it is preferred that the nozzle exhaust pressure is between 25 to 50 Pa. Thus, it can be noted that by adjusting the ratio of the nozzle exhaust pressure to the internal pressure of the process chamber at 1:1 to 3:1 (specifically, 1.25:1 to 2.5:1), it is possible to enable the pyrolysis of the precursor gas within the nozzle to become uniform within a substrate processing region. Since the tip of the nozzle is opened, the supply amount of the gas into the process chamber is about 1/10. Thus, if the nozzle exhaust pressure is set at 25 Pa and if the flow rate of HCDS is increased to ten times (as indicated by a solid line E), the overall concentration is lowered although the difference between the top gas supply hole (#32) and the bottom gas supply hole (#0) is 1.6 times. By controlling the flow velocity within the nozzle, it is possible to control the decomposition of the gas and to control the composition of a film deposited on the processed substrate to a desired value.

An inert gas is supplied from the second carrier gas supply pipe 234b into the process chamber 201 via the fourth mass flow controller 241d, the seventh pipeline 250g, the sixth valve 243f, the eighth pipeline 250h, the pipeline 400a and the second gas supply holes 248b of the lower end side of the second nozzle 233b. The inert gas is exhausted to the exhaust pipeline 315 via the gas exhaust pipe 231 and the valve 314. Thus, the purging is performed. This makes it possible to keep clean the inner wall of the second nozzle 233b. At this time, the internal pressure of the second nozzle 233b is set higher than the internal pressure of the process chamber 201.

A cleaning gas is supplied to the second nozzle 233b via the cleaning gas supply pipe 234c, the fifth mass flow controller 241e, the ninth pipeline 250i, the seventh valve 243g, the eighth pipeline 250h and the pipeline 400a. The cleaning gas is exhausted to the exhaust pipeline 315 via the pipeline 400b, the tenth pipeline 250j and the valve 316. Thus, the film deposited inside the second nozzle 233b is removed by the cleaning gas, for example, fluorine, supplied from the second gas supply system. At this time, by setting the internal pressure of the process chamber 201 to become higher than the internal pressure of the second nozzle 233b, only the film deposited inside the second nozzle 233b is removed without causing etching damage to the film deposited inside the process chamber 201. It is therefore possible to significantly reduce the risk of particles being generated.

(1-4) Boat

The boat 217 which supports a plurality of wafers 200 in multiple stages and at regular intervals is disposed in a central region within the reaction tube 203. The boat 217 can be loaded into and unloaded from the reaction tube 203 by a boat elevator mechanism (not shown). Furthermore, there is provided a boat rotation mechanism 267 for rotating the boat 217 to improve the processing uniformity. The boat 217 supported on the boat support table 218 is rotated by driving the boat rotation mechanism 267.

(1-5) Controller

Figure 7:
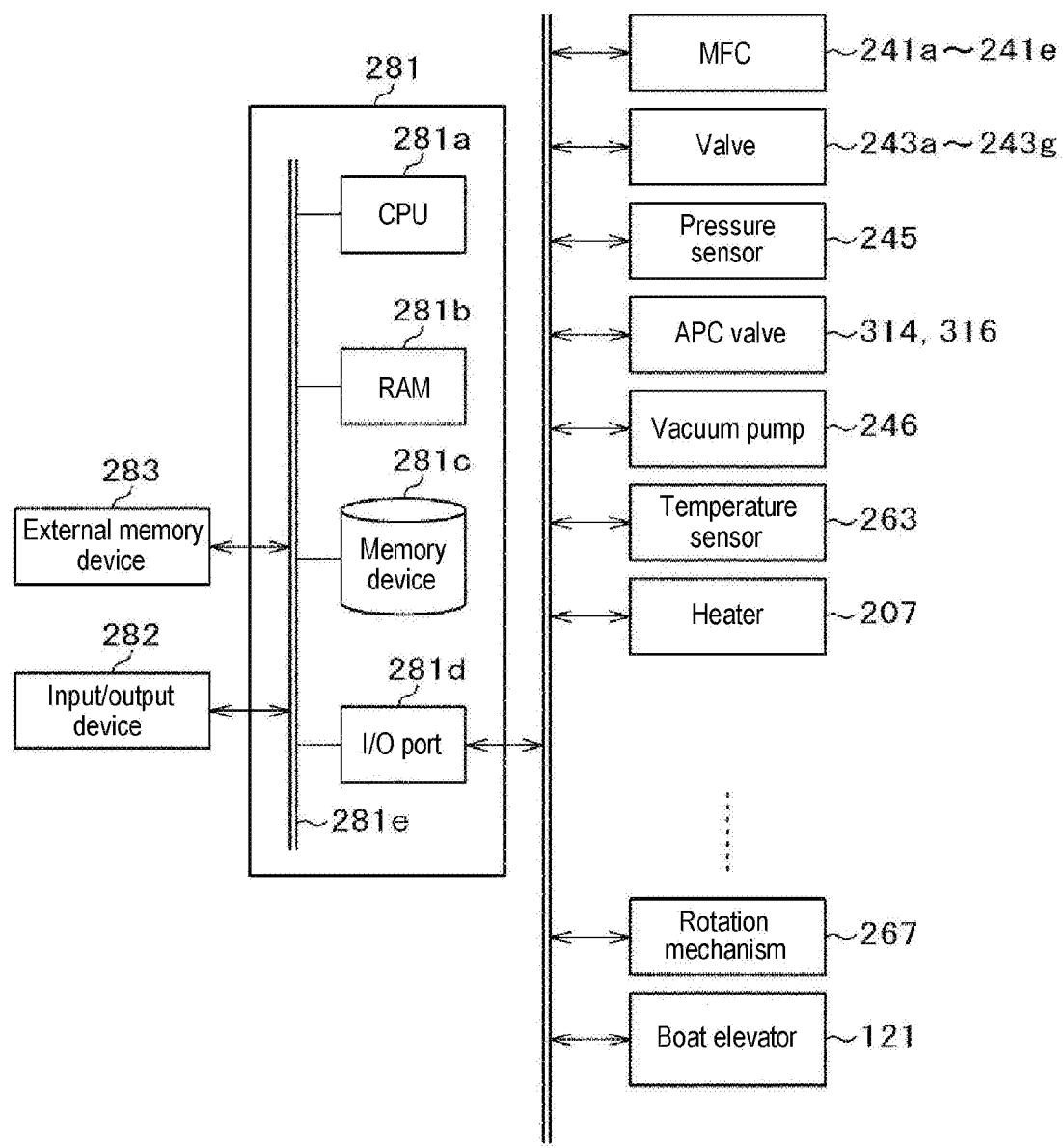
FIG. 7 is a block diagram for explaining a controller of the substrate processing apparatus suitably used in the embodiment of the present disclosure.

Next, the controller as a control part (control means) will be described with reference to FIG. 7. FIG. 7 is a block diagram illustrating the controller of the substrate processing apparatus according to the embodiment. The controller 281 controls the flow rate adjustment operations of the first to fifth mass flow controllers 241a, 241b, 241c, 241d and 241e, the opening/closing operations of the first to seventh valves 243a, 243b, 243c, 243d, 243e, 243f and 243g, the opening/closing and pressure regulation operations of the valves 314 and 316, the temperature adjustment operation of the heater 207, the startup and stop of the vacuum pump 246, the rotation speed adjustment operation of the boat rotation mechanism 267, and the elevating operation of the boat elevating mechanism.

As illustrated in FIG. 7, the controller 281, which is a control part (control means), may be configured as a computer including a central processing unit (CPU) 281a, a random access memory (RAM) 281b, a memory device 281c and an I/O port 281d. The RAM 281b, the memory device 281c and the I/O port 281d are configured to exchange data with the CPU 281a via an internal bus 281e. An input/output device 282 formed of, for example, a touch panel or the like, an external memory device 283 and the like are connected to the controller 281.

The memory device 281c is configured by, for example, a flash memory, a hard disk drive (HDD), or the like. A control program for controlling the operations of the substrate processing apparatus, a process recipe, in which sequences and conditions of substrate processing to be described later are written, and the like are readably stored in the memory device 281c. The process recipe is configured to cause the controller 281 to execute each sequence in a substrate processing process, which will be described later, to obtain a predetermined result. Furthermore, the RAM 281b is configured as a memory area (work area) in which a program, data and the like read by the CPU 281a are temporarily stored.

The I/O port 260d is connected to the mass flow controllers 241a, 241b, 241c, 241d and 241e, the valves 243a, 243b, 243c, 243d, 243e, 243f and 243g, the pressure sensor 245, the valves 314 and 316, the vacuum pump 246, the heater 207, the rotation mechanism 267, the boat elevator 121, and so forth.

The CPU 281a is configured to read the control program from the memory device 281c and execute the same. The CPU 281a is also configured to read the process recipe from the memory device 281c according to an input of an operation command from the input/output device 282. Furthermore, the CPU 281a is configured to control, according to the contents of the process recipe thus read, the flow rate adjustment operations of various kinds of gases performed by the mass flow controllers 241a, 241b, 241c, 241d and 241e, the opening/closing operations of the valves 243a, 243b, 243c, 243d, 243e, 243f and 243g, the opening/closing operations of the valves 314 and 316, the pressure regulation operations performed by the valves 314 and 316 based on the pressure sensor 245, the temperature adjustment operation of the heater 207 performed based on the temperature sensor 263, the on/off operation of the vacuum pump 246, the rotation and rotation speed control operations of the boat 217 performed by the rotation mechanism 267, the elevating operation of the boat 217 performed by the boat elevator 121, and so forth.

Furthermore, the controller 281 is not limited to being configured by a dedicated computer but may be configured by a general-purpose computer. For example, the controller 281 according to the present embodiment may be configured by preparing an external memory device 283 (e.g., a magnetic tape, a magnetic disc such as a flexible disc or a hard disc, an optical disc such as a CD, a DVD or the like, a magneto-optical disc such as an MO or the like, a semiconductor memory such as a USB memory, a memory card or the like), which stores the aforementioned program, and installing the program in a general-purpose computer through the use of the external memory device 283. Furthermore, the means for supplying the program to the computer is not limited to a case where the program is supplied via the external memory device 283. For example, the program may be supplied through the use of a communication means such as the Internet, a dedicated line or the like without going through the external memory device 283. In addition, the memory device 281c or the external memory device 283 is configured as a computer-readable recording medium.

(2) Substrate Processing Process

Next, descriptions will be made on a sequence example of a process for forming a film on a substrate (hereinafter also referred to as a film forming process) using the substrate processing apparatus 1 as a semiconductor manufacturing apparatus, which is one of processes for manufacturing a semiconductor device. In the present embodiment, descriptions will be made on an example in which a film is formed on a wafer 200 as a substrate by alternately supplying a first process gas (precursor gas) and a second process gas (reaction gas) to the wafer 200. Hereinafter, descriptions will be made on an example in which a silicon oxide film ($SiO_2$ film) (hereinafter also referred to as a SiO film) is formed on a wafer 200 using a hexachlorodisilane ($Si_2Cl_6$, abbreviation: HCD) gas as a precursor gas and an ozone ($O_3$) gas as a reaction gas. This substrate processing process may be, for example, one process for manufacturing a semiconductor device. In the following descriptions, the operations of the respective parts constituting the substrate processing apparatus 1 are controlled by the controller 281.

Figure 8:
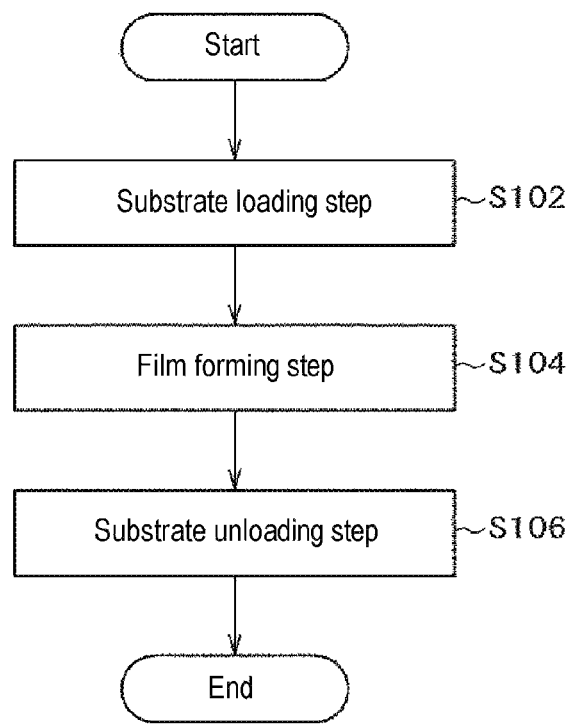
FIG. 8 is a flowchart for explaining a substrate processing process suitably used in the embodiment of the present disclosure.

The substrate processing process will be described with reference to FIG. 8. FIG. 8 is a flowchart illustrating the substrate processing process according to an example. In the film forming process according to the present embodiment, a SiO film is formed on a wafer 200 by performing, a predetermined number of times (once or more), a cycle which non-simultaneously performs a step of supplying a HCDS gas to the wafer 200 accommodated within a process chamber 201, a step of removing the HCDS gas (residual gas) from the interior of the process chamber 201, a step of supplying an $O_3$ gas to the wafer 200 accommodated within the process chamber 201 and a step of removing the $O_3$ gas (residual gas) from the interior of the process chamber 201.

In addition, the term "substrate" used herein may be synonymous with the term "wafer."

(Substrate Loading Step S102)

If a plurality of wafers 200 is charged in the boat 217 (wafer charging), as illustrated in FIG. 1, the boat 217 supporting the plurality of wafers 200 is lifted up by the boat elevator 121 and is loaded into the process chamber 201 (boat loading). In this state, the seal cap 219 seals the lower end of the reaction tube 203 through the O-ring 220.

(Film Forming Step S104)

When stabilized under certain film forming conditions (e.g., temperature, time, etc.), the following three steps, namely steps 1 to 3, are sequentially implemented. In between steps 1 to 3, the wafers 200 are heated to a predetermined temperature by the heater 207.

(Step 1)

At this step, the HCDS gas is supplied to the wafers 200 accommodated within the process chamber 201. The HCDS gas is allowed to flow from the precursor supply part 300. A carrier gas ($N_2$) is allowed to flow through the second carrier gas supply pipe 234b. The third valve 243c, the fourth valve 243d, the fifth valve 243e, the seventh valve 243g and the eighth valve 243h of the precursor supply part 300, the sixth valve 243f of the second carrier gas supply pipe 234b, and the valve 314 of the gas exhaust pipe 231 are opened in their entirety. The carrier gas is supplied from the second carrier gas supply pipe 234b and is flow-rate-adjusted by the fourth mass flow controller 241d. The HCDS gas is supplied from the precursor supply part 300 and is allowed to flow in a flow-rate-adjusted state. The HCDS gas is mixed with the flow-rate-adjusted carrier gas. The HCDS gas mixed with the carrier gas is supplied from the second gas supply holes 248b of the second nozzle 233b into the process chamber 201 after passing through the eighth pipeline 250h and the pipeline 400a connected to the lower end of the second nozzle 233b and is exhausted from the gas exhaust pipe 231. At this time, the internal pressure of the process chamber 201 is maintained at, for example, 20 Pa, by appropriately adjusting the valve 314. In the meantime, the mixed gas of the HCDS gas and the carrier gas is exhausted from the tenth pipeline 250j via the valve 316 after passing through the pipeline 400b connected to the end portion of the second nozzle 233b. At this time, the exhaust pressure within the second nozzle 233b is maintained in a range of 25 to 50 Pa by appropriately adjusting the valve 316. In this case, the temperature of the heater 207 is set so that the wafer temperature falls within a range of 400 to 650 degrees C.° and becomes, for example, 630 degrees C.°. The internal pressure of the process chamber 201 and the internal exhaust pressure of the second nozzle 233b may be between 25 to 100 Pa. It was found through a simulation that by regulating the pressures in this way, the pyrolysis of HCDS within the second nozzle 233b becomes uniform in the position facing the substrate processing region. As a result, HCDS is supplied from the respective gas supply holes 248b at the same flow rate. By supplying HCDS into the process chamber 201 in this way, a first layer, for example, a silicon (Si)-containing layer having a thickness of from less than one atomic layer to several atomic layers, is formed on the uppermost surface of the wafer 200.

(Step 2)

After the first layer is formed, the third valve 243c of the precursor supply part 300 is closed to stop the supply of HCDS. At this time, the valve 314 of the gas exhaust pipe 231 and the valve 316 of the tenth pipeline 250j are kept opened. The interior of the process chamber 201 is exhausted until the internal pressure thereof becomes 20 Pa or less, thereby removing the residual HCDS gas from the interior of the process chamber 201 and the interior of the second nozzle 233b. At this time, if an inert gas such as $N_2$ or the like is supplied into the process chamber 201 and the tenth pipeline 250j, it is possible to further enhance the effect of removing the residual HCDS gas.

(Step 3)

An $O_3$ gas is supplied from the first gas supply part 232 and a carrier gas ($N_2$) is allowed to flow through the first carrier gas supply pipe 234a. The first valve 243a of the first gas supply part 232 and the second valve 243b of the first carrier gas supply pipe 234a are opened. At this time, the valve 314 is kept opened and the valve 316 is closed. The carrier gas is supplied from the first carrier gas supply pipe 234a and is flow-rate-adjusted by the second mass flow controller 241b. The $O_3$ gas is supplied from the first gas supply part 232 and is flow-rate-adjusted by the first mass flow controller 241a. The $O_3$ gas is mixed with the flow-rate-adjusted carrier gas. The $O_3$ gas mixed with the carrier gas is supplied from the first gas supply holes 248a of the first nozzle 233a into the process chamber 201 and is exhausted from the gas exhaust pipe 231. At this time, the temperature of the heater 207 is set so that just like the gas supply at step 1, the wafer temperature falls within a range of 400 to 650 degrees C.° and becomes, for example, 630 degrees C.°. By the supply of the $O_3$ gas, the Si-containing layer formed on the surface of the wafer 200 reacts with $O_3$. Thus, a $SiO_2$ layer (hereinafter also referred to as a SiO layer) as a second layer is formed on the wafer 200. After the second layer is formed, the first valve 243a of the first gas supply part 232 and the second valve 243b of the first carrier gas supply pipe 234a are closed and the interior of the process chamber 201 is vacuum-exhausted by the vacuum pump 246, thereby removing the residual $O_3$ gas. At this time, if an inert gas such as $N_2$ or the like is supplied into the reaction tube 203, it is possible to further enhance the effect of removing the residual $O_3$ gas from the process chamber 201.

By performing, a predetermined number of times (n times), a cycle which non-simultaneously or non-synchronously performs steps 1 to 3 described above, it is possible to form a $SiO_2$ film (hereinafter also referred to as a SiO film) having a predetermined composition and a predetermined film thickness on the wafer 200. The aforementioned cycle may be repeated multiple times. In other words, the thickness of the second layer (SiO layer) formed when performing the aforementioned cycle once may be set smaller than a predetermined film thickness and the aforementioned cycle may be repeated multiple times until the film thickness of the SiO film formed by laminating the second layer (SiO layer) reaches a predetermined film thickness.

(Substrate Unloading Step S106)

Next, the boat 217 mounted with the wafers 200 on which the SiO$_2$ films are formed are unloaded from the process chamber 201.

(3) Cleaning Process

Next, the cleaning of the interior of the process chamber and the cleaning of the nozzle will be described with reference to FIGS. 4, 12, 13A, 13B, 13C and 14.

Figure 12:
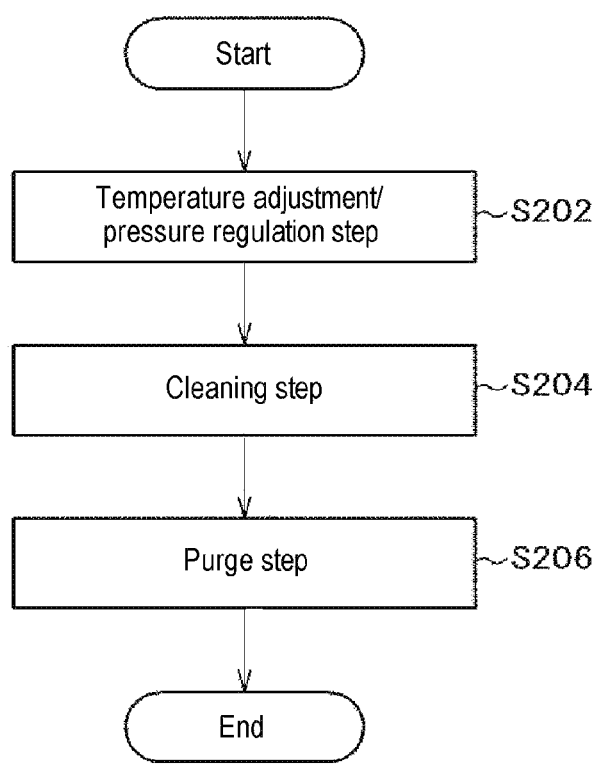
FIG. 12 is a flowchart for explaining a cleaning process of the interior of the process chamber suitably used in the embodiment of the present disclosure.

(3-1) Process for Separately Cleaning the Interior of the Process Chamber and the Interior of the Nozzle (3-1-1) Cleaning Process of the Interior of the Process Chamber As illustrated in FIG. 12, the cleaning process of the interior of the process chamber is performed as follows.

Temperature Adjustment/Pressure Regulation Step (Step S202): The sixth valve 243f of the second carrier gas supply pipe 234b is opened. The inert gas (N$_2$) is allowed to flow through the eighth pipeline 250h and the pipeline 400a and is supplied from the second gas supply holes 248b of the second nozzle 233b into the process chamber 201, thereby setting the internal pressure of the process chamber 201 at a high pressure (or an atmospheric pressure).

Cleaning Step (Step S204): The seventh valve 243h of the cleaning gas supply pipe 234c is opened. The cleaning gas is allowed to flow through the eighth pipeline 250h and the pipeline 400a. The cleaning gas is supplied from the second gas supply holes 248b of the second nozzle 233b into the process chamber 201 and is exhausted from the gas exhaust pipe 231. At this time, the valve 316 is closed and the valve 314 is opened. The inert gas may be or may not be supplied to the second nozzle 233b.

Purge Step (Step S206): The second valve 243b of the first carrier gas supply pipe 234a is opened. The inert gas (N$_2$) is allowed to flow through the fourth pipeline 250d. The inert gas is supplied from the first gas supply holes 248a of the first nozzle 233a into the process chamber 201 and is exhausted from the gas exhaust pipe 231. The sixth valve 243f of the second carrier gas supply pipe 234b is opened. The inert gas (N$_2$) is allowed to flow through the eighth pipeline 250h and the pipeline 400a. The inert gas is supplied from the second gas supply holes 248b of the second nozzle 233b into the process chamber 201 and is exhausted from the gas exhaust pipe 231. At this time, the valve 316 and the valve 314 are opened.

(3-1-2) Cleaning Process of the Interior of the Nozzle

The cleaning process of the interior of the nozzle is performed by one of three examples described below. The cleaning process of the interior of the nozzle may be performed before or after the cleaning process of the interior of the process chamber.

(3-1-2-1) First Example

Figure 13A:
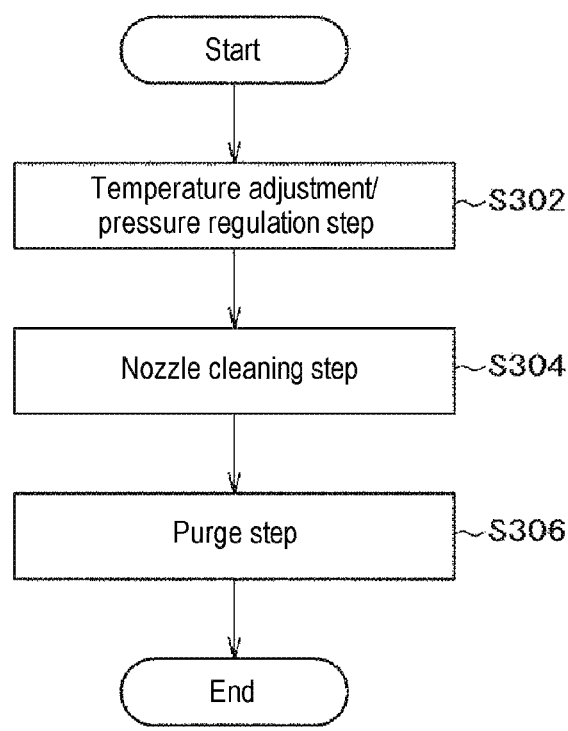
FIG. 13A is a flowchart for explaining a first example of a nozzle cleaning process suitably used in the embodiment of the present disclosure.

As illustrated in FIG. 13A, a nozzle cleaning process of a first example is performed as follows.

Temperature Adjustment/Pressure Regulation Step (Step S302): The sixth valve 243f of the second carrier gas supply pipe 234b is opened. The inert gas (N$_2$) is allowed to flow through the eighth pipeline 250h and the pipeline 400a. The inert gas is supplied from the second gas supply holes 248b of the second nozzle 233b into the process chamber 201 and is exhausted from the gas exhaust pipe 231, thereby setting the internal pressure of the process chamber 201 at a high pressure (or an atmospheric pressure). At this time, the valve 316 is closed and the valve 314 is opened.

Nozzle Cleaning Step (Step S304): The seventh valve 243h of the cleaning gas supply pipe 234c is opened. The cleaning gas is allowed to flow through the eighth pipeline 250h and the pipeline 400a. The cleaning gas is supplied to the second nozzle 233b and is exhausted from the tenth pipeline 250j via the pipeline 400b. At this time, in order to prevent the cleaning gas from being supplied from the second nozzle 233b into the process chamber 201, the second valve 243b of the first carrier gas supply pipe 234a is opened and the inert gas (N$_2$) is allowed to flow through the fourth pipeline 250d. The inert gas is supplied from the first gas supply holes 248a of the first nozzle 233a into the process chamber 201. The valve 314 is closed and the valve 316 is opened.

Purge Step (Step S306): The second valve 243b of the first carrier gas supply pipe 234a is opened. The inert gas (N$_2$) is allowed to flow through the fourth pipeline 250d. The inert gas is supplied from the first gas supply holes 248a of the first nozzle 233a into the process chamber 201 and is exhausted from the gas exhaust pipe 231. The sixth valve 243f of the second carrier gas supply pipe 234b is opened. The inert gas (N$_2$) is allowed to flow through the eighth pipeline 250h and the pipeline 400a. The inert gas is supplied from the second nozzle 233b into the process chamber 201 and is exhausted from the tenth pipeline 250j via the pipeline 400b. At this time, the valve 316 and the valve 314 are opened.

(3-1-2-2) Second Example

Figure 13B:
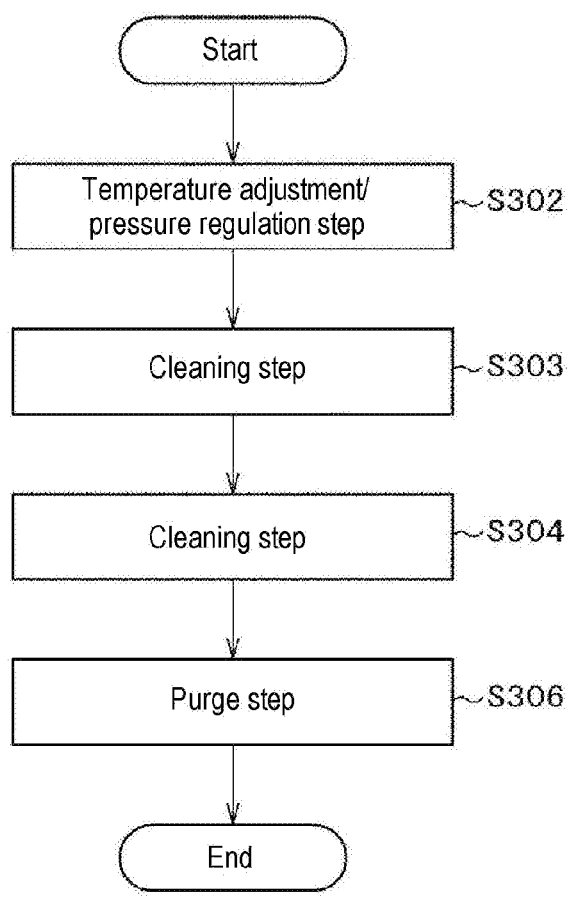
FIG. 13B is a flowchart for explaining a second example of the nozzle cleaning process suitably used in the embodiment of the present disclosure.

As illustrated in FIG. 13B, a nozzle cleaning process of a second example is performed as follows.

Temperature Adjustment/Pressure Regulation Step (Step S302): The sixth valve 243f of the second carrier gas supply pipe 234b is opened. The inert gas (N$_2$) is allowed to flow through the eighth pipeline 250h and the pipeline 400a. The inert gas is supplied from the second gas supply holes 248b of the second nozzle 233b into the process chamber 201 and is exhausted from the gas exhaust pipe 231, thereby setting the internal pressure of the process chamber 201 at a high pressure (or an atmospheric pressure). At this time, the valve 316 is closed and the valve 314 is opened.

First Nozzle Cleaning Step (Step S304): The seventh valve 243h of the cleaning gas supply pipe 234c is opened. The cleaning gas is allowed to flow through the eighth pipeline 250h and the pipeline 400a and is supplied to the second nozzle 233b and the pipeline 400b. At this time, the valve 314 and the valve 316 are closed. Furthermore, the second valve 243b of the first carrier gas supply pipe 234a is opened. The inert gas (N$_2$) is allowed to flow through the fourth pipeline 250d. The inert gas may be or may not be supplied from the first gas supply holes 248a of the first nozzle 233a into the process chamber 201.

Second Nozzle Cleaning Step (Step S304): The seventh valve 243h of the cleaning gas supply pipe 234c is opened. The cleaning gas is allowed to flow through the eighth pipeline 250h and the pipeline 400a. The cleaning gas is supplied to the second nozzle 233b and is exhausted from the gas exhaust pipe 231 via the pipeline 400b. At this time, the valve 316 is opened and the valve 314 is closed. Furthermore, the second valve 243b of the first carrier gas supply pipe 234a is opened. The inert gas (N$_2$) is allowed to flow through the fourth pipeline 250d. The inert gas may be or may not be supplied from the first gas supply holes 248a of the first nozzle 233a into the process chamber 201.

(3-1-2-3) Third Example

Figure 13C:
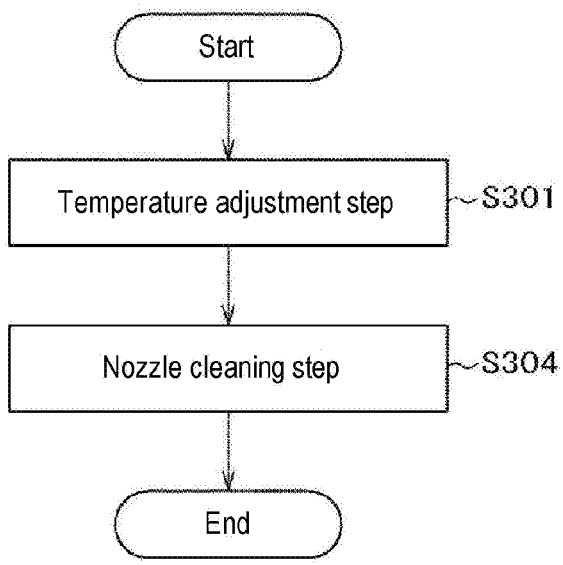
FIG. 13C is a flowchart for explaining a third example of the nozzle cleaning process suitably used in the embodiment of the present disclosure.

As illustrated in FIG. 13C, a nozzle cleaning process of a third example is performed as follows.

Temperature Adjustment Step (Step S301): The sixth valve 243f of the second carrier gas supply pipe 234b is opened. The inert gas (N$_2$) is allowed to flow through the eighth pipeline 250h and the pipeline 400a. The inert gas is supplied from the second gas supply holes 248b of the second nozzle 233b into the process chamber 201, thereby converting the internal atmosphere of the process chamber 201 to an inert gas atmosphere.

Nozzle Cleaning Step (Step S304): The seventh valve 243h of the cleaning gas supply pipe 234c is opened. The cleaning gas is allowed to flow through the eighth pipeline 250h and the pipeline 400a. The cleaning gas is supplied to the second nozzle 233b and is exhausted from the gas exhaust pipe 231 via the pipeline 400b. At this time, in order to prevent the cleaning gas from being supplied from the second nozzle 233b into the process chamber 201, the second valve 243b of the first carrier gas supply pipe 234a is opened and the inert gas (N$_2$) is allowed to flow through the fourth pipeline 250d. The inert gas is supplied from the first gas supply holes 248a of the first nozzle 233a into the process chamber 201. The valve 314 is closed and the valve 316 is opened.

(3-2) Process for Cleaning Both the Process Chamber and the Nozzle

As illustrated in FIG. 14, a process for cleaning the process chamber and the nozzle is performed as follows.

Temperature Adjustment Step (Step S402): The sixth valve 243f of the second carrier gas supply pipe 234b is opened. The inert gas (N$_2$) is allowed to flow through the eighth pipeline 250h and the pipeline 400a. The inert gas is supplied from the second gas supply holes 248b of the second nozzle 233b into the process chamber 201, thereby converting the internal atmosphere of the process chamber 201 to an inert gas atmosphere.

Cleaning Step (Step S404): The seventh valve 243h of the cleaning gas supply pipe 234c is opened. The cleaning gas is allowed to flow through the eighth pipeline 250h and the pipeline 400a. The cleaning gas is supplied from the second gas supply holes 248b of the second nozzle 233b into the process chamber 201 and is exhausted from the gas exhaust pipe 231. At this time, the valve 316 is closed and the valve 314 is opened. An inert gas may be or may not be supplied to the second nozzle 233b. However, it is desirable to supply the inert gas as a carrier gas.

Purge Step (Step S406): The second valve 243b of the first carrier gas supply pipe 234a is opened. The inert gas (N$_2$) is allowed to flow through the fourth pipeline 250d. The inert gas is supplied from the first gas supply holes 248a of the first nozzle 233a into the process chamber 201 and is exhausted from the gas exhaust pipe 231. The sixth valve 243f of the second carrier gas supply pipe 234b is opened. The inert gas (N$_2$) is allowed to flow through the eighth pipeline 250h and the pipeline 400a. The inert gas is supplied from the second gas supply holes 248b of the second nozzle 233b into the process chamber 201 and is exhausted from the gas exhaust pipe 231. At this time, the valve 316 and the valve 314 are opened.

(3-3) The process (3-1) for separately cleaning the interior of the process chamber and the interior of the nozzle and the process (3-2) for cleaning both the process chamber and the nozzle may be combined with each other.

The cleaning gas used in the present embodiment may be a halogen-element-containing gas which contains at least one halogen element selected from a group consisting of fluorine (F), chlorine (Cl), bromine (Br) and iodine (I), or may be a combination of the halogen-element-containing gases. The cleaning gas may be a combination of these halogen elements. It may also be possible to use combinations of the cleaning gases, hydrogen (H$_2$) and nitrogen (N$_2$).

<Modification 1>

Figure 9A:
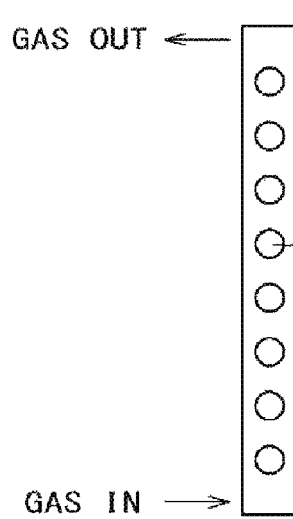
FIG. 9A is a view for explaining a shape of a nozzle according to modification 1.
Figure 9B:
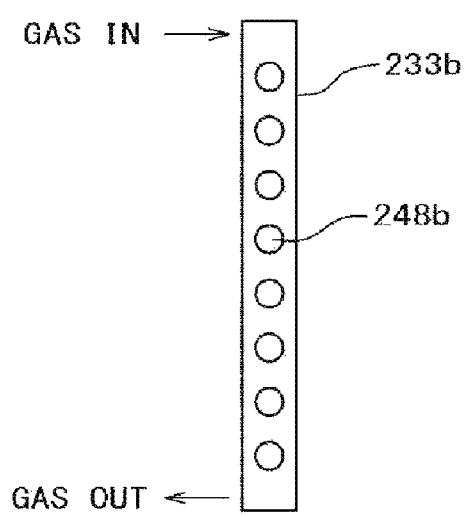
FIG. 9B is a view for explaining the shape of the nozzle according to modification 1.

The another shape of a second nozzle according to modification 1 and the gas supply directions will be described with reference to FIGS. 9A and 9B. FIGS. 9A and 9B are views illustrating an I-shaped second nozzle. The shape of the second nozzle 233b is not limited to the U-like shape but may be an I-like shape as illustrated in FIGS. 9A and 9B. In this case, as illustrated in FIG. 9A, the connection destination of the gas supply system (the pipeline 400a) may be the lower end of the nozzle and the connection destination of the gas exhaust system (pipeline 400b) may be the upper end of the nozzle. Alternatively, as illustrated in FIG. 9B, the connection destination of the gas supply system (the pipeline 400a) may be the upper end of the nozzle and the connection destination of the gas exhaust system (pipeline 400b) may be the lower end of the nozzle.

<Modification 2>

Figure 10A:
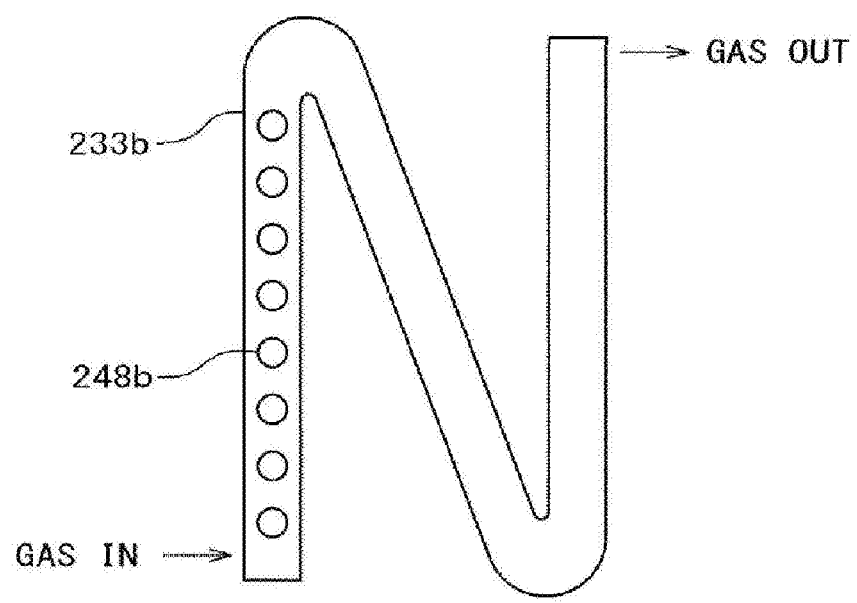
FIG. 10A is a view for explaining a shape of a nozzle according to modification 2.
Figure 10B:
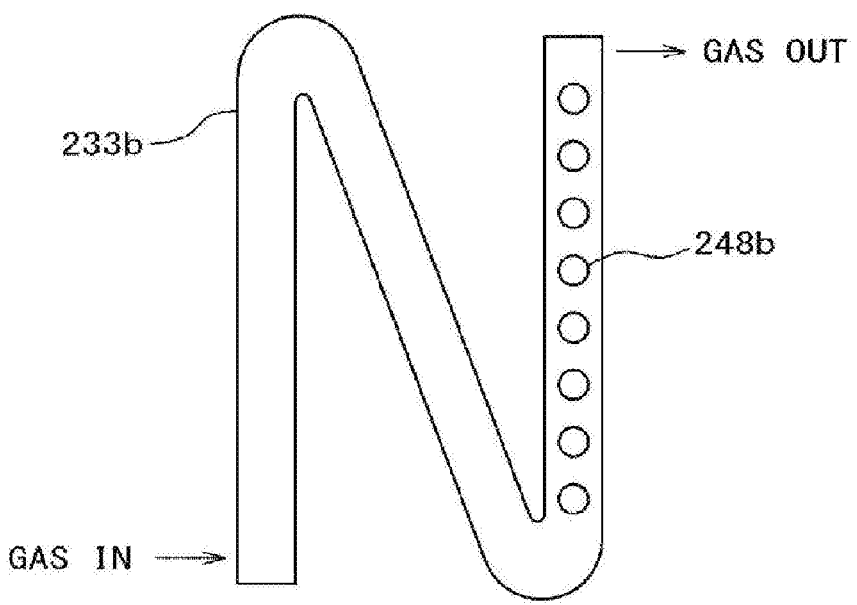
FIG. 10B is a view for explaining the shape of the nozzle according to modification 2.
Figure 10C:
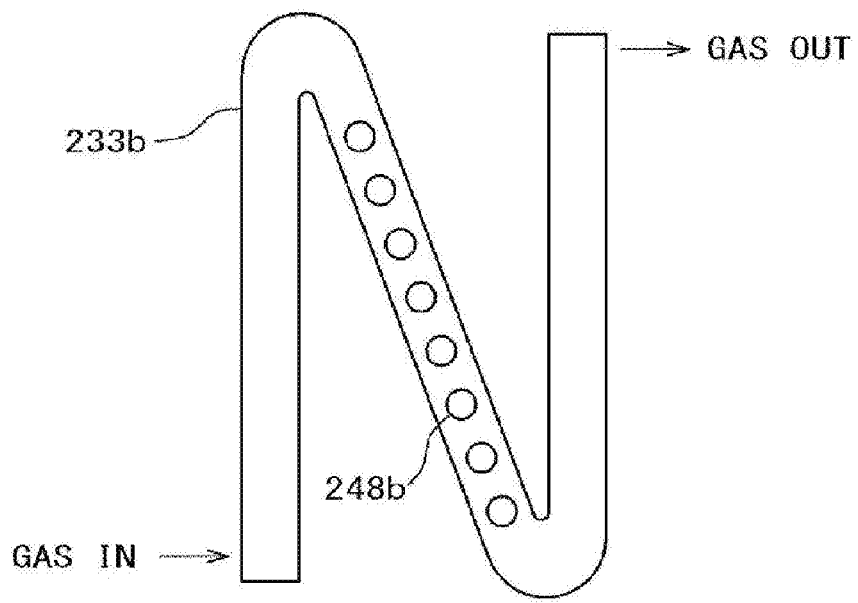
FIG. 10C is a view for explaining the shape of the nozzle according to modification 2.
Figure 10D:
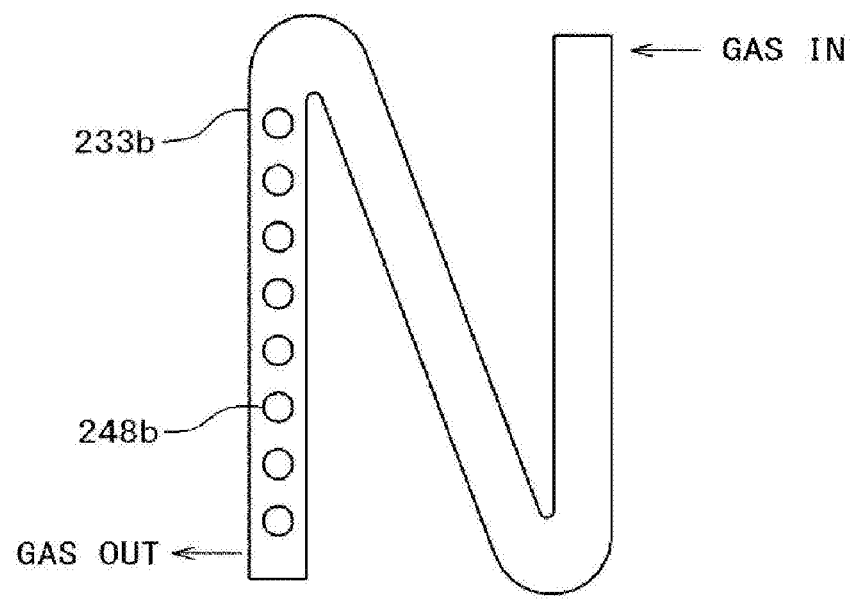
FIG. 10D is a view for explaining the shape of the nozzle according to modification 2.
Figure 10E:
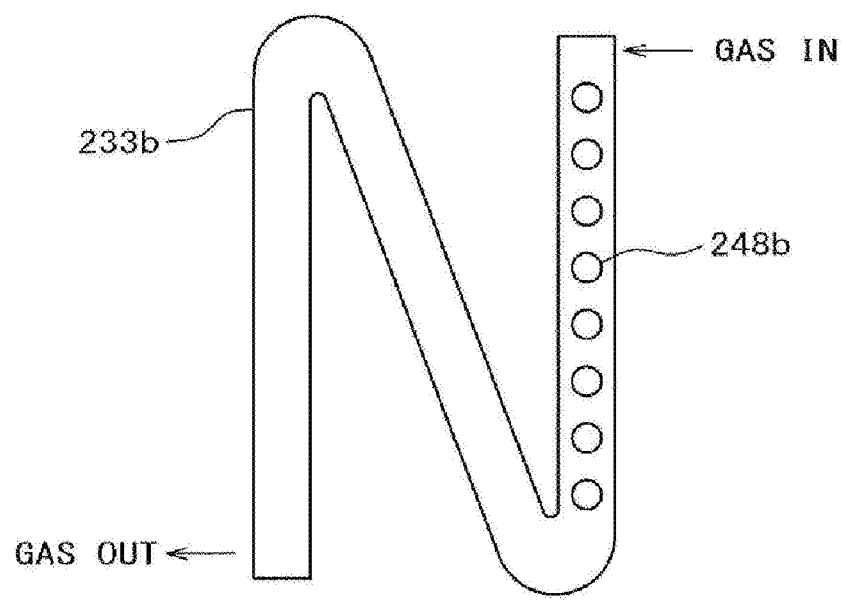
FIG. 10E is a view for explaining the shape of the nozzle according to modification 2.
Figure 10F:
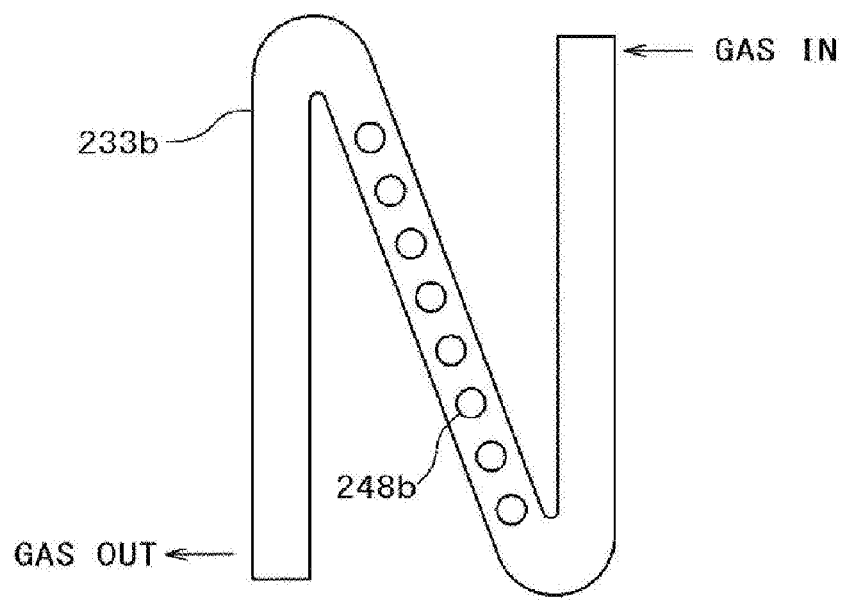
FIG. 10F is a view for explaining the shape of the nozzle according to modification 2.

The another shape of a second nozzle according to modification 2 and the gas supply directions will be described with reference to FIGS. 10A to 10F. FIGS. 10A to 10F are views illustrating N-shaped second nozzles. The shape of the second nozzle 233b is not limited to the U-like shape but may be an N-like shape as illustrated in FIGS. 10A to 10F. As illustrated in FIGS. 10A and 10D, the second gas supply holes 248b may be formed from the lower portion to the upper portion of the second nozzle 233b at the gas supply system side. As illustrated in FIGS. 10B and 10E, the second gas supply holes 248b may be formed from the lower portion to the upper portion of the second nozzle 233b at the gas exhaust system side. Furthermore, as illustrated in FIGS. 10C and 10F, the second gas supply holes 248b may be formed from the upper portion to the lower portion of an obliquely-extending section of the second nozzle 233b existing between the gas supply system side and the gas exhaust system side. In addition, as illustrated in FIGS. 10A to 10C, the connection destination of the gas supply system (the pipeline 400a) may be the lower end of the nozzle and the connection destination of the gas exhaust system (pipeline 400b) may be the upper end of the nozzle. Alternatively, as illustrated in FIGS. 10D to 10F, the connection destination of the gas supply system (the pipeline 400a) may be the upper end of the nozzle and the connection destination of the gas exhaust system (pipeline 400b) may be the lower end of the nozzle.

According to the embodiment of the present disclosure, at least one of the effects set forth in the flowing items (a) to (g) may be achieved.

(a) It is possible to control the pyrolysis of the precursor gas within the nozzle (gas supply pipe). It is possible to ensure that the concentration of the gas generated by the pyrolysis of the precursor gas and contributed to the substrate processing becomes (substantially) uniform within the nozzle facing the substrate processing region in which the substrates are disposed. It is possible to improve the uniformity of the films deposited on the substrates accommodated within the process chamber.

(b) By controlling the exhaust pressure and the gas flow velocity within the nozzle, it is possible to ensure that the distribution of the gas contributed to the film formation becomes uniform within the nozzle facing the substrate processing region.

(c) By adjusting the ratio of the internal pressure of the nozzle to the internal pressure of the process chamber at 1:1 to 5:1, it is possible to ensure that the pyrolysis of the precursor gas within the nozzle becomes uniform within the nozzle facing the substrate processing region.

(d) By adjusting the hole diameter and/or the hole number, it is possible to make uniform the flow rate of the gas supplied from the nozzle.

(e) By keeping clean the inner wall of the nozzle through purging using the inert gas or cleaning the interior of the nozzle using the gas, it is possible to suppress the generation of particles. This makes it possible to improve the performance and throughput of a highly-integrated semiconductor device.

(f) Since the film adhering to the inner wall of the nozzle can be efficiently removed by the gas cleaning, it is possible to suppress clogging of the holes formed in the nozzle.

(g) By adjusting the internal pressure of the process chamber and the flow rate of the gas supplied into the process chamber, it is possible to remove only the film adhering to the inner wall of the nozzle by the gas cleaning and to remove both the film adhering to the nozzle and the film adhering to the inner wall of the process chamber. It is therefore possible to efficiently remove the film adhering to the nozzle and the film adhering to the inner wall of the process chamber regardless of the kind and thickness of the films.

In the present embodiment, the substrate processing apparatus is configured as, for example, a semiconductor manufacturing apparatus which implements a processing process in a semiconductor device (IC) manufacturing method. In addition, as the substrate processing apparatus, it may be possible to use a vertical apparatus (hereinafter simply referred to as a processing apparatus) which implements an oxidation process, a diffusion process, a CVD process or the like.

According to some embodiments of the present disclosure, by controlling the exhaust pressure and the gas flow velocity within the nozzle, it is possible to improve uniformity of the film thickness.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
    a first gas supply pipe that supplies a processing gas, which contributes to film formation, to a process chamber;
    a second gas supply pipe, disposed inside the process chamber, that includes:
        a first end portion connected to the first gas supply pipe;
        a plurality of holes through which a first portion of the processing gas is supplied to a substrate processing region; and
        a second end portion that extends outside the process chamber and is configured to exhaust a second portion of the processing gas, which is not supplied to the substrate processing region, outside the process chamber;
    a first gas exhaust pipe that is connected between the process chamber and an exhaust pipeline, and configured to discharge the first portion of the processing gas from the process chamber;
    a second gas exhaust pipe that is connected between the second end portion and the exhaust pipeline, and configured to discharge the second portion of the processing gas from the second gas supply pipe;
    a first gas exhaust valve installed in the first gas exhaust pipe and configured to adjust an internal pressure of the process chamber;
    a second gas exhaust valve installed in the second gas exhaust pipe and configured to adjust an exhaust pressure of the second gas supply pipe;
    a heater configured to heat an interior of the process chamber;
    a substrate holder configured to be loaded into the process chamber and horizontally hold a plurality of substrates in a state where the plurality of substrates is arranged in multiple stages in a vertical direction;
    a memory configured to store a program for operating the first gas exhaust valve, the second gas exhaust valve, and the heater; and
    a processor configured to, based on the program read from the memory:
        when the processing gas is supplied to the process chamber, control the first gas exhaust valve to adjust the internal pressure of the process chamber;
        when the processing gas is supplied to the process chamber, control the second gas exhaust valve to adjust the exhaust pressure of the second gas supply pipe such that the exhaust pressure of the second gas supply pipe is set to be higher than the internal pressure of the process chamber, and to control a flow velocity of the processing gas such that pyrolysis of the processing gas within the second gas supply pipe is controlled to be uniform within the substrate processing region:
        control the first gas exhaust valve and the second gas exhaust valve such that the processing gas is partially supplied through the holes to the substrate processing region and partially exhausted through the second gas exhaust pipe to the exhaust pipeline without being supplied through the holes to the substrate processing region; and
        control the heater to set a concentration of the processing gas, which is generated as a result of the pyrolysis of the processing gas by the heater, to be uniform in the substrate processing region in which the substrates are disposed,
    wherein the second gas supply pipe is located in a space between an inner wall of the process chamber and the substrate holder and includes an extending part along the vertical direction, and
    wherein the holes are located on a side surface of the second gas supply pipe at intervals in the vertical direction.

2. The substrate processing apparatus of claim 1, wherein the second gas exhaust valve adjusts, in advance before the processing gas is supplied to the process chamber, a gas flow velocity of an inert gas within the second gas supply pipe or an exhaust pressure within the second gas supply pipe depending on an opening degree of the second gas exhaust valve.

3. The substrate processing apparatus of claim 2, wherein the second gas exhaust valve adjusts the opening degree so as to maintain the exhaust pressure in the second gas supply pipe in a range of 25 to 50 Pa.

4. The substrate processing apparatus of claim 1, wherein only a film adhering to an inner wall of the second gas supply pipe is removed by supplying a predetermined amount of a cleaning gas from the first gas supply pipe into the second gas supply pipe and exhausting the cleaning gas to the exhaust pipeline via the second gas exhaust pipe while suppressing supply of the cleaning gas into the process chamber.

5. The substrate processing apparatus of claim 4, wherein the supply of the cleaning gas into the process chamber is suppressed by setting the internal pressure of the process chamber to become higher than an internal pressure of the second gas supply pipe.

6. The substrate processing apparatus of claim 5, further comprising:
a carrier gas supply pipe differing from the second gas supply pipe,
wherein the supply of the cleaning gas into the process chamber is suppressed by supplying an inert gas from the carrier gas supply pipe into the process chamber.

7. The substrate processing apparatus of claim 4, wherein the cleaning gas contains at least one halogen element selected from a group consisting of fluorine (F), chlorine (Cl), bromine (Br) and iodine (I).

8. The substrate processing apparatus of claim 1, wherein the holes are formed in a sidewall of the second gas supply pipe at regular intervals, a diameter of the holes is selected from an arbitrary value between 0.1 mm and 5 mm, and a number of the holes is an arbitrary number of three times or less of a number of substrates to be processed.

9. The substrate processing apparatus of claim 1, wherein the second gas supply pipe has a U-like shape and the holes are formed in the second gas supply pipe at either a side of the first gas supply pipe or the side of the exhaust pipeline.

10. The substrate processing apparatus of claim 1, wherein the second gas supply pipe has an I-like shape and a connecting point between the second gas supply pipe and the first gas supply pipe is arbitrarily selected from an upper end and a lower end of the second gas supply pipe.

11. The substrate processing apparatus of claim 1, wherein the second gas supply pipe has an N-like shape and the holes are formed in at least one of a first-gas-supply-pipe-side section of the second gas supply pipe, an exhaust-pipeline-side section of the second gas supply pipe and a center-side section of the second gas supply pipe.

12. The substrate processing apparatus of claim 1, wherein a ratio of an internal pressure of the second gas supply pipe to the internal pressure of the process chamber is adjusted to be in a range of 1:1 to 5:1.

13. The substrate processing apparatus of claim 12, wherein the internal pressure of the second gas supply pipe is adjusted to be higher than the internal pressure of the process chamber.

* * * * *